(12) United States Patent
Kishishita

(10) Patent No.: US 10,615,122 B2
(45) Date of Patent: Apr. 7, 2020

(54) SEMICONDUCTOR INTEGRATED CIRCUIT DEVICE HAVING REDUCED POWER CONSUMPTION

(71) Applicant: SOCIONEXT INC., Kanagawa (JP)

(72) Inventor: Keisuke Kishishita, Kyoto (JP)

(73) Assignee: Socionext Inc., Kanagawa (JP)

( * ) Notice: Subject to any disclaimer, the term of this patent is extended or adjusted under 35 U.S.C. 154(b) by 22 days.

(21) Appl. No.: 15/987,275

(22) Filed: May 23, 2018

(65) Prior Publication Data
US 2018/0269154 A1 Sep. 20, 2018

Related U.S. Application Data

(63) Continuation of application No. PCT/JP2016/082479, filed on Nov. 1, 2016.

(51) Int. Cl.
| | | |
|---|---|---|
| H01L 23/52 | (2006.01) | |
| H01L 23/528 | (2006.01) | |
| H01L 27/118 | (2006.01) | |
| H01L 23/522 | (2006.01) | |
| H01L 27/02 | (2006.01) | |
| H01L 27/092 | (2006.01) | |

(52) U.S. Cl.
CPC ...... *H01L 23/5286* (2013.01); *H01L 23/5226* (2013.01); *H01L 27/0207* (2013.01); *H01L 27/0922* (2013.01); *H01L 27/11807* (2013.01); *H01L 2027/11881* (2013.01)

(58) Field of Classification Search
CPC ............. H01L 23/5286; H01L 23/5226; H01L 27/0207; H01L 27/0922; H01L 27/11807; H01L 2027/11881
See application file for complete search history.

(56) References Cited

U.S. PATENT DOCUMENTS

| | | | | |
|---|---|---|---|---|
| 2005/0240891 A1* | 10/2005 | Just | ...................... | H03K 17/687 716/110 |
| 2006/0114025 A1* | 6/2006 | Frenkil | ............... | G06F 17/5031 326/81 |
| 2008/0246108 A1 | 10/2008 | Sakurabayashi | | |
| 2009/0295463 A1* | 12/2009 | Katou | ................. | H01L 27/0207 327/534 |

(Continued)

FOREIGN PATENT DOCUMENTS

| | | |
|---|---|---|
| JP | 2008-277788 A | 11/2008 |
| JP | 2009-038273 A | 2/2009 |
| JP | 2015-095272 A | 5/2015 |

OTHER PUBLICATIONS

English translation of International Search Report issued in Application No. PCT/JP2016/082479 dated Jan. 24, 2017.

*Primary Examiner* — Scott B Geyer
(74) *Attorney, Agent, or Firm* — McDermott Will & Emery LLP

(57) ABSTRACT

A semiconductor integrated circuit device having a power supply strap formed in a layer above a power supply line which supplies power to standard cells, a switch cell provided for the power supply line, the switch cell being capable of switching between electrical connection and disconnection between the power supply line and the power supply strap, and a sub-power supply strap connected to at least two power supply lines including the power supply line provided with the switch cell.

18 Claims, 7 Drawing Sheets

(56) References Cited

U.S. PATENT DOCUMENTS

| | | | |
|---|---|---|---|
| 2010/0308667 A1* | 12/2010 | Sakurabayashi | H01L 27/0207 |
| | | | 307/147 |
| 2013/0221538 A1* | 8/2013 | Funane | H01L 27/1116 |
| | | | 257/774 |
| 2015/0131396 A1 | 5/2015 | Sosogi et al. | |
| 2015/0145555 A1 | 5/2015 | Koog et al. | |
| 2017/0062474 A1* | 3/2017 | Lee | H01L 27/11807 |
| 2017/0336845 A1* | 11/2017 | Raj | H01L 23/525 |

* cited by examiner

SEMICONDUCTOR INTEGRATED CIRCUIT DEVICE HAVING REDUCED POWER CONSUMPTION

CROSS-REFERENCE TO RELATED APPLICATIONS

This is a continuation of International Application No. PCT/JP2016/082479 filed on Nov. 1, 2016, which claims priority to Japanese Patent Application No. 2015-229630 filed on Nov. 25, 2015. The entire disclosures of these applications are incorporated by reference herein.

BACKGROUND

The present disclosure relates to a technology to interrupt power supply in a semiconductor integrated circuit device.

BACKGROUND ART

Power interruption is one of techniques for reducing power consumption of a semiconductor integrated circuit device. Through the power interruption, internal circuitry of a semiconductor integrated circuit device is divided into a plurality of circuit blocks, and power supply to non-operating blocks is interrupted, thereby reducing leakage of current that leads to an increase of power consumption. Japanese Unexamined Patent Publication No. 2008-277788 discloses a configuration in which switches for supplying/interrupting power are respectively provided for lines of standard cells in a power interruption region to achieve power supply control. Each of the standard cells receives power from a power supply strap via the switch and a standard cell power supply line.

SUMMARY

According to the configuration of Japanese Unexamined Patent Publication No. 2008-277788, a switch for supplying/interrupting power is required for each of the standard cell power supply lines in a circuit block to which power supply is to be interrupted. Specifically, multiple switches need to be arranged in the circuit block. Thus, the switches occupy a large area to increase the entire area of the circuit block, and the presence of the multiple switches reduces the flexibility of layout of the standard cells. This may bring about problems such as the increase in the area caused by the multiple switches, and the increase in the number of man hours required for design due to timing closure difficulties derived from the decrease in the flexibility of layout of the standard cells.

Japanese Unexamined Patent Publication No. 2008-277788 further discloses that an additional switch is provided for a region which requires enhanced power supply. However, if the standard cells have been arranged at high density in that region, the standard cells need to be rearranged to create space for the switch. If the layout of the standard cells is changed to create the space for the switch, wiring convergence becomes worse, and another new switch may be required due to change of current consumption distribution. This may increase the man hours required for design. Even if a new switch is added, enhanced power supply is achieved only for the standard cell power supply line provided with the new switch. If multiple standard cell power supply lines need enhanced power supply, the switch is required for each of the standard cell power supply lines.

In view of the foregoing, the present disclosure intends to reduce power consumption of a semiconductor integrated circuit device using a power interruption technique, without increasing the device area and the number of man hours required for design.

In one embodiment of the present disclosure, a semiconductor integrated circuit device includes: a plurality of standard cell rows, each of which includes a plurality of standard cells arranged in a first direction, arranged in a second direction perpendicular to the first direction when viewed in plan; a plurality of power supply lines extending in the first direction, and supplying power to the standard cells, a power supply strap formed in a layer above the plurality of power supply lines, and extending in the second direction; a switch cell provided for one of the plurality of power supply lines, and capable of switching between electrical connection and disconnection between the one of the power supply lines and the power supply strap in accordance with a control signal; and a sub-power supply strap formed in a layer above the plurality of power supply lines, and extending in the second direction, wherein the sub-power supply strap is connected to at least two of the power supply lines including the one of the power supply lines provided with the switch cell.

In this embodiment, the power supply strap extending in the second direction perpendicular to the first direction when viewed in plan is provided in a layer above a plurality of power supply lines extending in the first direction. The switch cell capable of switching between electrical connection and disconnection between the power supply lines and the power supply strap in accordance with a control signal is provided for one of the plurality of power supply lines. The sub-power supply strap extending in the second direction is arranged in a layer above the plurality of power supply lines, and is connected to at least two of the power supply lines including the one provided with the switch cell. Thus, power coming from the power supply strap via the switch cell is supplied not only to the power supply line provided with the switch cell, but also to another power supply line via the sub-power supply strap. Specifically, the standard cells which receive power from the power supply line connected to the sub-power supply strap can receive power via the switch cell provided for another power supply line. This can eliminate the need of providing the switch cell for each of the power supply lines, and enhance the power supply without increasing the number of switch cells. Therefore, power consumption of the semiconductor integrated circuit device can be reduced by the power interruption technique without causing the problems such as the increase in the area caused by the multiple switches, and the increase in the number of man hours required for design due to timing closure difficulties derived from the decrease in the flexibility of layout of the standard cells.

The present disclosure can reduce power consumption of a semiconductor integrated circuit device using a power interruption technique, without increasing the area and the number of man hours required for design.

DETAILED DESCRIPTION

Embodiments will be described below with reference to the drawings.

First Embodiment

Figure 1:
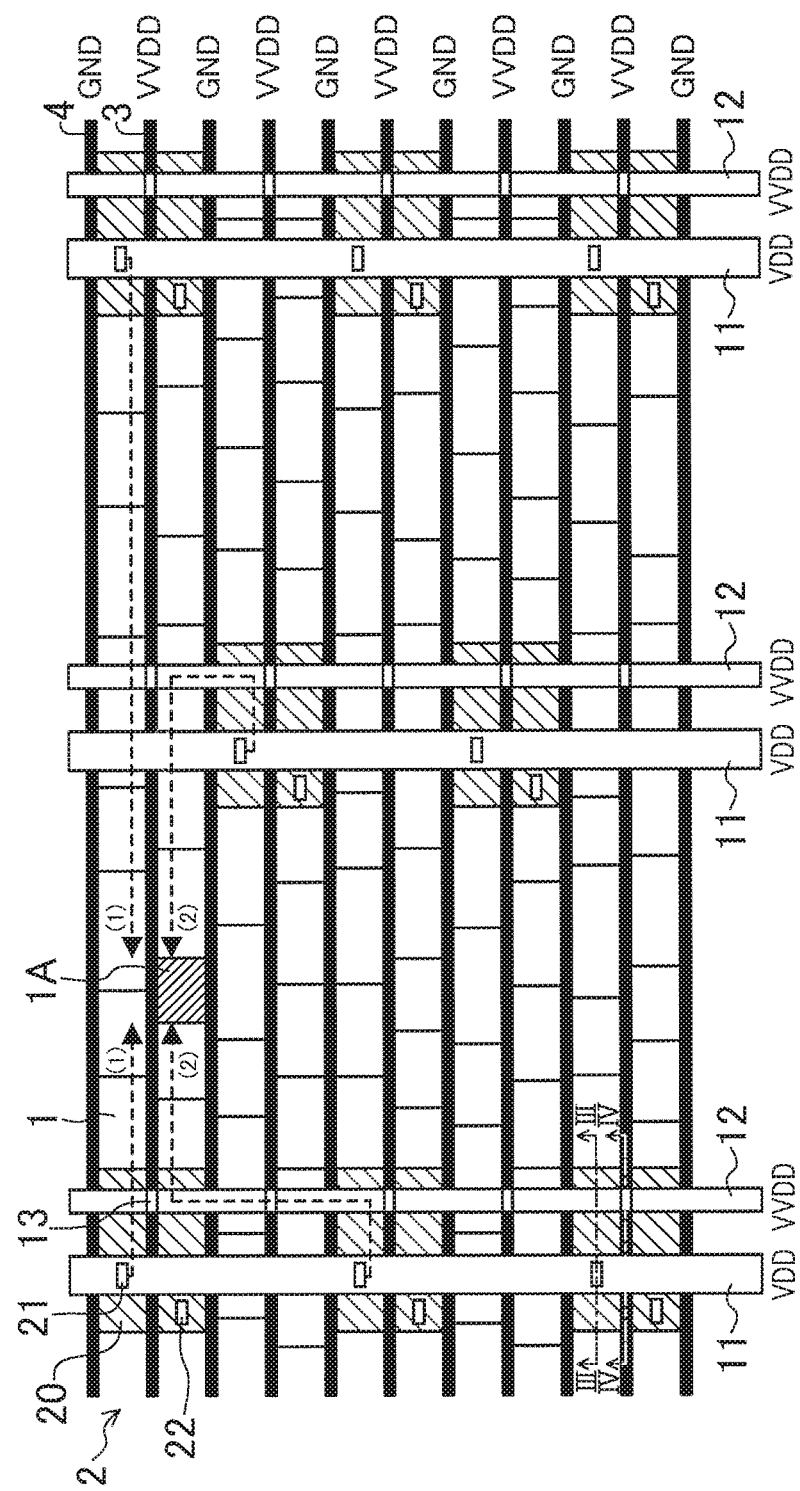
FIG. 1 is a plan view illustrating a configuration of a semiconductor integrated circuit device according to a first embodiment.

FIG. 1 is a plan view illustrating a configuration of a semiconductor integrated circuit device according to a first embodiment. In this drawing, and other plan views to be described later, a layout pattern of a circuit block to which power supply is interrupted is illustrated in a simplified manner. The semiconductor integrated circuit device shown in FIG. 1 includes a plurality of standard cells 1 arranged on a substrate. Standard cell rows 2, each including a plurality of standard cells 1 arranged in a horizontal direction of the drawing (first direction), are arranged in a vertical direction of the drawing (second direction perpendicular to the first direction when viewed in plan). Each standard cell 1 is a basic circuit element which functions as, for example, an inverter or a logical circuit. A semiconductor integrated circuit device which achieves desired functions can be designed and manufactured by arranging and combining the standard cells 1 via wiring. Each standard cell 1 has an N-type region in which a P-type metal oxide semiconductor (MOS) transistor (PMOS) is formed, and a P-type region in which an N-type MOS transistor (NMOS) is formed. In the present disclosure, the standard cell 1 has the N- and P-type regions arranged side by side in the vertical direction of the drawing. The arrangement of the N- and P-type regions is reversed between two adjacent standard cell rows 2. The internal structure of the standard cell 1 is not shown in the drawings.

Standard cell power supply lines 3 (with an indication "VVDD" on the right), each of which supplies a power supply potential to the standard cells 1, and ground supply lines 4 (with an indication "GND" on the right), each of which supplies a ground potential to the standard cells 1, are alternately arranged in the vertical direction with a single standard cell row 2 interposed between them. The standard cell power supply lines 3 and the ground supply lines 4 extend in the horizontal direction in the drawing. The standard cell power supply lines 3 serving as power supply lines of the present disclosure feeds a power supply potential to two adjacent standard cell rows 2. The ground supply lines 4 feeds a ground potential to two adjacent standard cell rows 2. For each of the standard cell power supply lines 3, a switch cell 20 (hatched in the drawing) is provided. Specifically, the configuration shown in FIG. 1 includes two standard cell power supply lines 3 which are arranged adjacent to each other, and respectively provided with the switch cells 20. The switch cell 20 is able to control power supply/interruption of the standard cells 1, and perform switching between electrical connection or disconnection between the standard cell power supply line 3 and a power supply strap 11, which will be described later, in accordance with a control signal. The control signal may be sent from, for example, a control block which controls power interruption.

Figure 2:
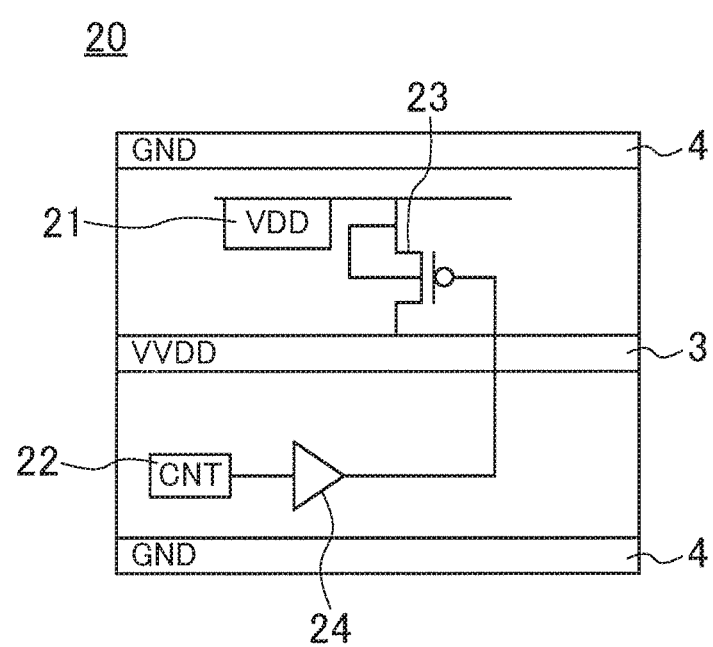
FIG. 2 is a schematic diagram illustrating an example of a configuration of a switch cell.

FIG. 2 is a schematic diagram illustrating an example of a configuration of the switch cell 20. FIG. 2 illustrates the configuration with circuit symbols. Actually, the configuration includes diffusion regions, gate wiring, and metal wiring arranged as appropriate. The switch cell 20 shown in FIG. 2 is a double-height cell, and includes an input terminal 21 connected to a power supply strap 11, a control terminal 22 which receives a control signal, a PMOS 23, and a buffer 24 which receives the control signal given to the control terminal 22. The PMOS 23 has a source connected to the input terminal 21, a drain connected to the standard cell power supply line 3, and a gate which receives the output of the buffer 24. When the control signal is high, the PMOS 23 is not conducted, and the input terminal 21 and the standard cell power supply line 3 are electrically disconnected. When the control signal is low, the PMOS 23 is conducted, and the input terminal 21 and the standard cell power supply line 3 are electrically connected. Although not shown in FIG. 2, power is supplied to the buffer 24 via the input terminal 21.

Referring back to FIG. 1, the power supply strap 11 is arranged in a layer above the standard cell rows 2 and the standard cell power supply lines 3 to extend in the vertical direction of the drawing. The power supply strap 11 is connected to the input terminal 21 of the switch cell 20 arranged under the power supply strap 11. Further, a sub-power supply strap 12 is also arranged in a layer above the standard cell rows 2 and the standard cell power supply lines 3 to extend in the vertical direction of the drawing. The sub-power supply strap 12 is connected to the standard cell power supply lines 3 passing under the sub-power supply strap 12 through via structures 13. In FIG. 1, the power supply strap 11 overlaps with the switch cells 20 when viewed in plan. The sub-power supply strap 12 also overlaps with the switch cells 20 when viewed in plan. In the present specification, the "power supply strap" is a power supply line extending in a direction perpendicular to the standard cell rows 2. Although not shown in FIG. 1, a power supply strap for supplying a ground potential is also arranged in a layer above the standard cell rows 2 and the standard cell power supply lines 3 to extend in the vertical direction of the drawing.

In FIG. 1, "VDD" indicates lines from the power supply to the switch cells 20, i.e., the power supply straps 11, and "VVDD" indicate lines that go beyond the switch cells 20, i.e., the sub-power supply straps 12 and the standard cell power supply lines 3. The same is applied to the other drawings. Note that when the PMOS 23 of each switch cell 20 is in conduction, the power supply potential is supplied through both of the power supply lines "VDD" and "VVDD."

Figure 3:
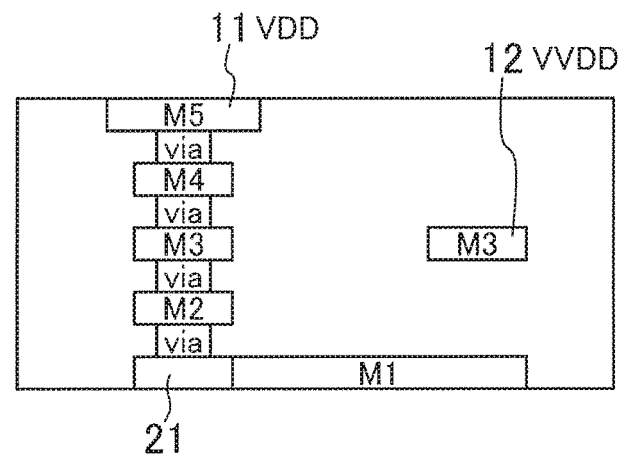
FIG. 3 is a cross-sectional view taken along line III-III of FIG. 1.
Figure 4:
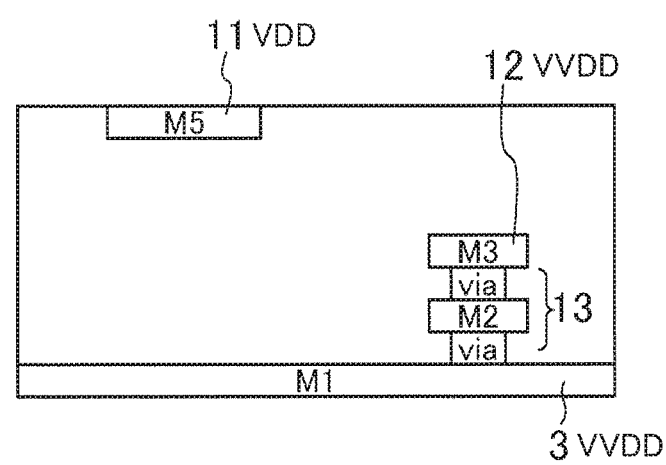
FIG. 4 is a cross-sectional view taken along line IV-IV of FIG. 1.

FIG. 3 is a cross-sectional view taken along line III-III of FIG. 1, and FIG. 4 is a cross-sectional view taken along line IV-IV of FIG. 1, both of which illustrate a region provided with the switch cell 20 in cross section. The semiconductor integrated circuit device of FIG. 1 has five or more wiring layers on the substrate. As shown in FIGS. 3 and 4, first to fifth wiring layers (M1 to M5) are stacked in this order on the substrate. The power supply strap 11 is formed in the fifth wiring layer (M5), and the sub-power supply strap 12 in the third wiring layer (M3). That is, the sub-power supply strap 12 is formed in a layer below the power supply strap 11. The standard cell power supply lines 3 are formed in the first wiring layer (M1). Although not shown, the ground supply lines 4 are also formed in the first wiring layer, and signal lines of the standard cells 1 are mainly formed in the first wiring layer. In FIG. 1, the first, second, and fourth wiring layers are preferentially routed in the horizontal direction, while the third and fifth wiring layers in the vertical direction.

Now, power supply to the standard cell 1A will be discussed below. The standard cell power supply line 3 which directly supplies a power supply potential to the standard cell 1A is provided with the switch cell 20, from which power is directly supplied to the standard cell 1A (path (1)). The standard cell 1A also receives power from another standard cell power supply line 3, which is not connected to the standard cell 1A, via the sub-power supply strap 12 (path (2)). Specifically, the standard cell 1A receives power from the switch cell 20 provided for the standard cell power supply line 3 which is directly connected to the standard cell 1A. The standard cell 1A further receives power from the switch cell 20 provided for another standard cell power supply line 3 different from the one directly connected to the standard cell 1A via the sub-power supply strap 12.

Thus, in this embodiment, the power supply strap 11 extending in the second direction perpendicular to the first direction when viewed in plan is provided in a layer above the plurality of standard cell power supply lines 3 extending in the first direction. The switch cell 20, which is capable of switching between electrical connection and disconnection between the standard cell power supply line 3 and the power supply strap 11 in accordance with a control signal, is provided for each of the plurality of standard cell power supply lines 3. The sub-power supply strap 12 extending in the second direction is provided in a layer above the plurality of standard cell power supply lines 3, and is connected to each of the standard cell power supply lines 3. Therefore, power coming from the power supply strap 11 via the switch cell 20 is supplied not only directly to the standard cell power supply line 3 provided with the switch cell 20, but also to the other standard cell power supply lines 3 via the sub-power supply strap 12. Specifically, the standard cell 1 can receive power via the switch cells 20 provided for the other standard cell power supply lines 3. This can enhance the power supply without increasing the number of switch cells 20.

In the configuration shown in FIG. 1, each of the sub-power supply straps 12 is arranged adjacent to an associated one of the power supply straps 11. However, this configuration is not limiting. For example, each of the sub-power supply straps 12 may be spaced apart from an associated one of the power supply straps 11 so that the sub-power supply straps 12 do not overlap with the switch cells 20 when viewed in plan. Alternatively, some of the sub-power supply straps 12 may be arranged apart from associated ones of the power supply straps 11.

In the configuration shown in FIG. 1, the switch cells 20 are arranged below the power supply straps 11, and overlap with the power supply straps 11 when viewed in plan. However, this configuration is not limiting. If the switch cells 20 are arranged below the power supply straps 11, a value of resistance of a path between the input terminal 21 of each switch cell 20 and the power supply strap 11, such as wiring and via structures, decreases. This can reduce drop of the power supply voltage. In the configuration shown in FIG. 1, the sub-power supply straps 12 overlap with the switch cells 20 when viewed in plan. However, this configuration is not limiting.

In the configuration shown in FIG. 1, each sub-power supply strap 12 is electrically connected to the standard cell power supply lines 3 passing under the sub-power supply strap 12. However, this configuration is not limiting. For example, the sub-power supply strap 12 may be connected to only some of the standard cell power supply lines 3 passing under the sub-power supply strap 12.

Specifically, the sub-power supply strap 12 may be connected to at least two standard cell power supply lines 3 including the one provided with the switch cell 20. Thus, the standard cell 1, which directly receives power from the standard cell power supply line 3 connected to the sub-power supply strap 12, can receive power via the switch cell 20 provided for another standard cell power supply line 3. This can enhance the power supply without increasing the number of switch cells 20.

Second Embodiment

Figure 5:
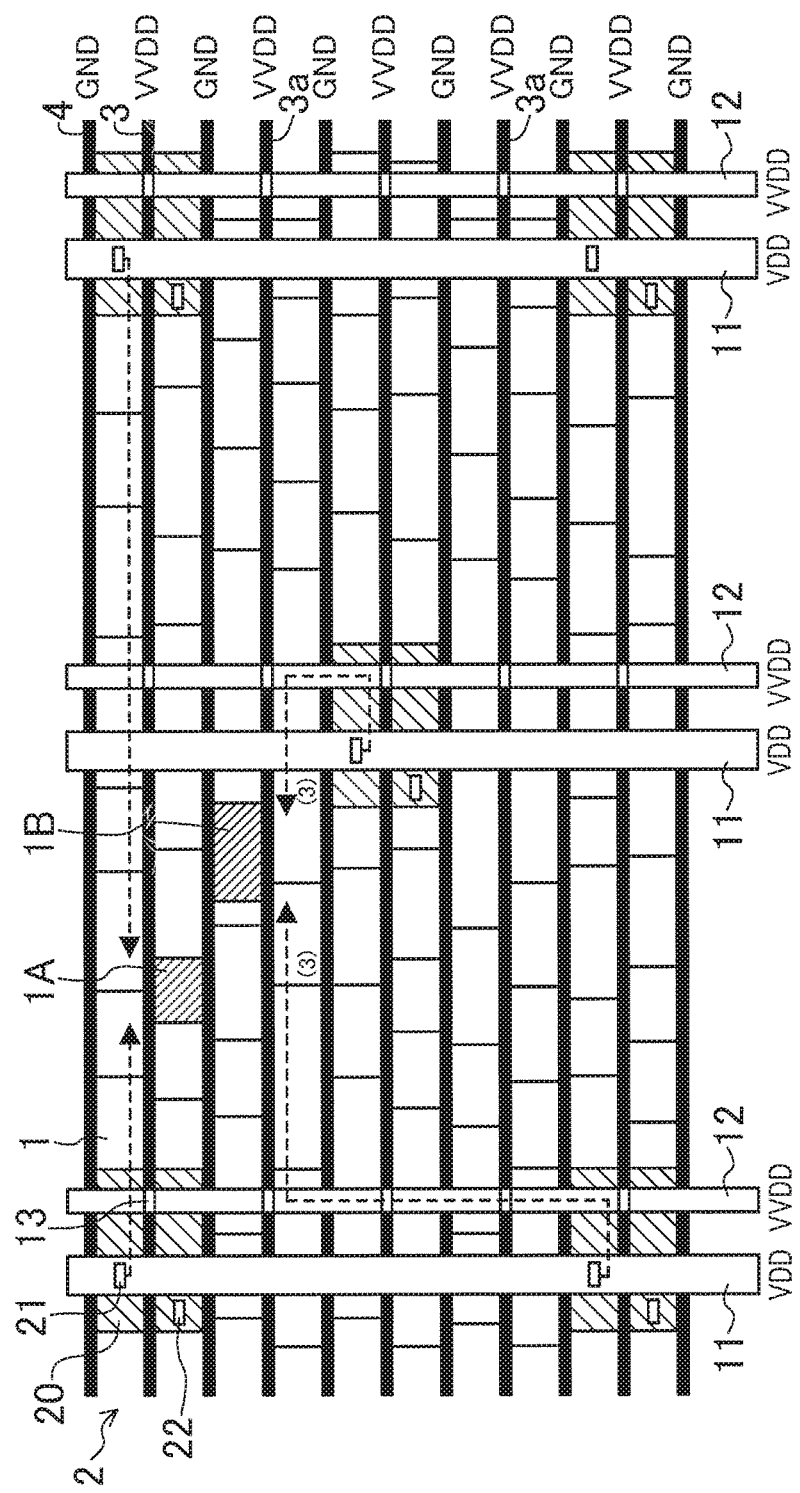
FIG. 5 is a plan view illustrating a configuration of a semiconductor integrated circuit device according to a second embodiment.

FIG. 5 is a plan view illustrating a configuration of a semiconductor integrated circuit device according to a second embodiment. In the second embodiment, the standard cells 1, the standard cell power supply lines 3, the ground supply lines 4, the power supply straps 11, and the sub-power supply straps 12 are arranged substantially in the same manner as shown in FIG. 1, and their detailed description may sometimes be omitted.

As compared with the configuration of FIG. 1, the configuration of FIG. 5 includes a smaller number of switch cells 20, and some of the standard cell power supply lines 3a are not provided with the switch cells 20. Specifically, the configuration shown in FIG. 5 includes two standard cell power supply lines 3 and 3a arranged adjacent to each other, one of which is provided with the switch cell 20, and the other is not. For example, the standard cell power supply line 3 which directly supplies power to the standard cell 1A is provided with the switch cell 20, while the standard cell power supply line 3a which directly supplies power to the standard cell 1B has no switch cell 20. Even without the switch cell, the standard cell 1B receives power from another standard cell power supply line 3 provided with the switch cell 20 via the sub-power supply strap 12 (path (3)).

Specifically, the presence of the sub-power supply strap 12 eliminates the need of providing the switch cell 20 for each of the standard cell power supply lines 3, and thus, reduces the number of switch cells 20. Further, the switch cells 20 can be arranged at desired intervals. This allows the standard cells 1 to be arranged with improved flexibility, and can enhance the timing closure.

Third Embodiment

Figure 6:
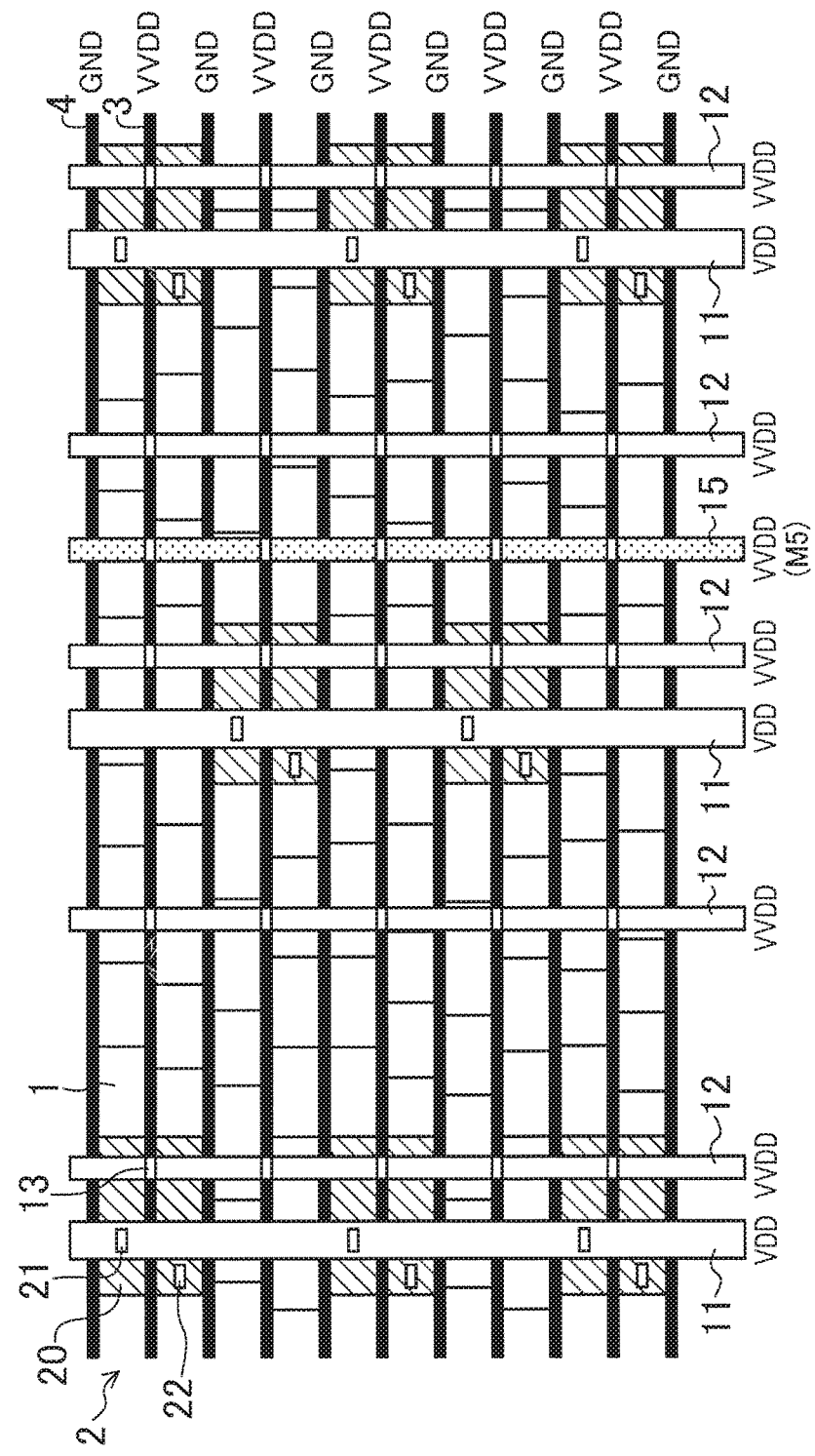
FIG. 6 is a plan view illustrating a configuration of a semiconductor integrated circuit device according to a third embodiment.

FIG. 6 is a plan view illustrating a configuration of a semiconductor integrated circuit device according to a third embodiment. In the third embodiment, the standard cells 1, the standard cell power supply lines 3, the ground supply lines 4, and the power supply straps 11 are arranged substantially in the same manner as shown in FIG. 1, and their detailed description may sometimes be omitted.

The configuration of FIG. 6 includes a larger number of sub-power supply straps 12 than the configuration of FIG. 1. For example, two sub-power supply straps 12 are arranged between the power supply strap 11 on the left and the power supply strap 11 at the center in FIG. 6. In addition, two sub-power supply straps 12 and a sub-power supply strap 15 formed in the fifth wiring layer (M5) are arranged between the center power supply strap 11 and the power supply strap 11 on the right in FIG. 6.

Figure 7:
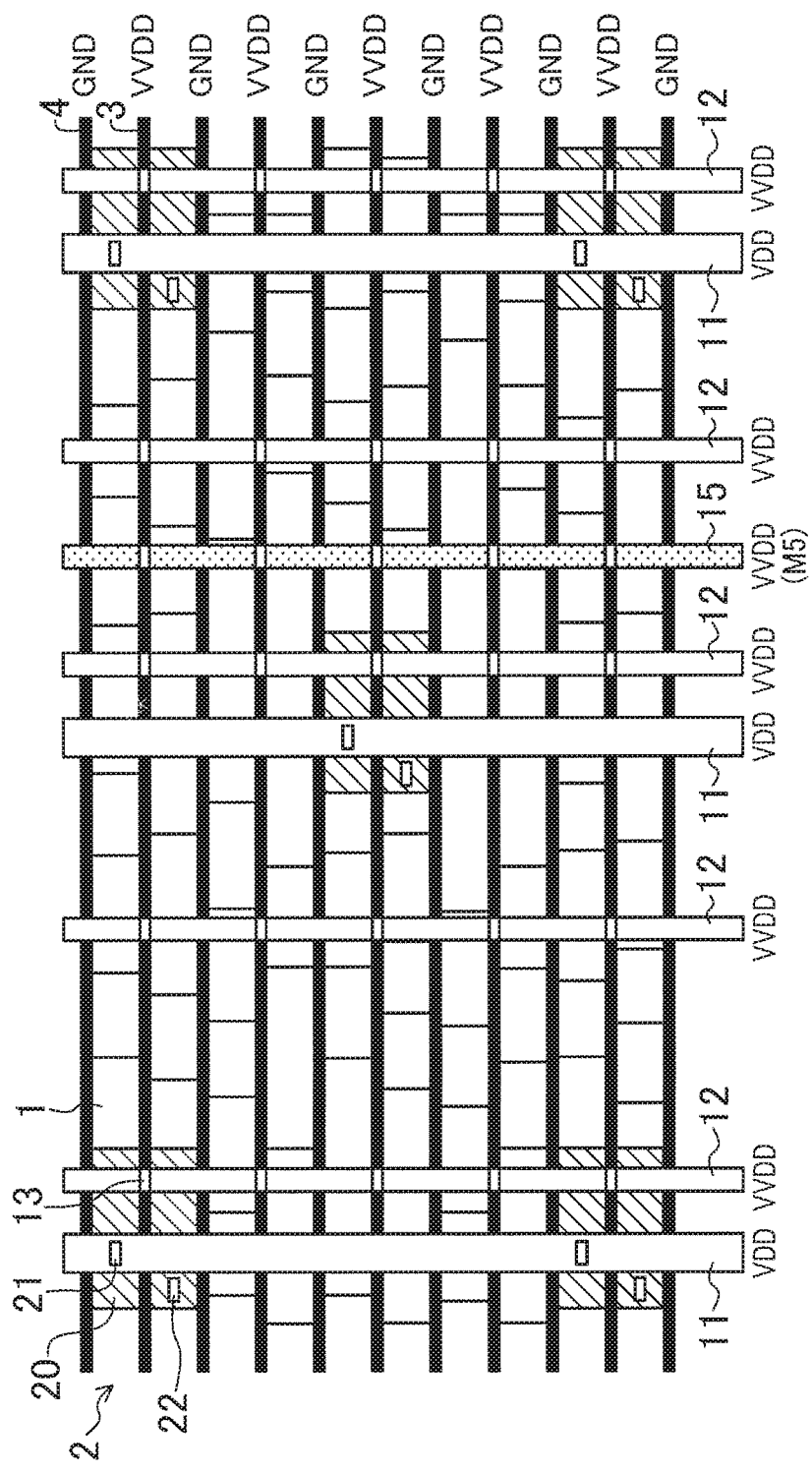
FIG. 7 is a plan view illustrating another configuration of the semiconductor integrated circuit device according to the third embodiment.

FIG. 7 is a plan view illustrating another configuration of a semiconductor integrated circuit device according to the third embodiment. The configuration of FIG. 7 includes, just like that of FIG. 6, a larger number of sub-power supply straps 12 and 15 than the configuration of the second embodiment shown in FIG. 5. Specifically, each of the configurations of FIGS. 6 and 7 includes two power supply straps 11 with two or more sub-power supply straps 12 and 15 arranged between them. Further, each of the configurations of FIGS. 6 and 7 includes two sub-power supply straps 12 and 15 which are formed in different wiring layers.

As can be seen, increasing the number of sub-power supply straps 12 and 15 can enhance the power supply without increasing the number of switch cells 20. Thus, the area of the semiconductor integrated circuit device does not significantly increase.

Fourth Embodiment

Figure 8:
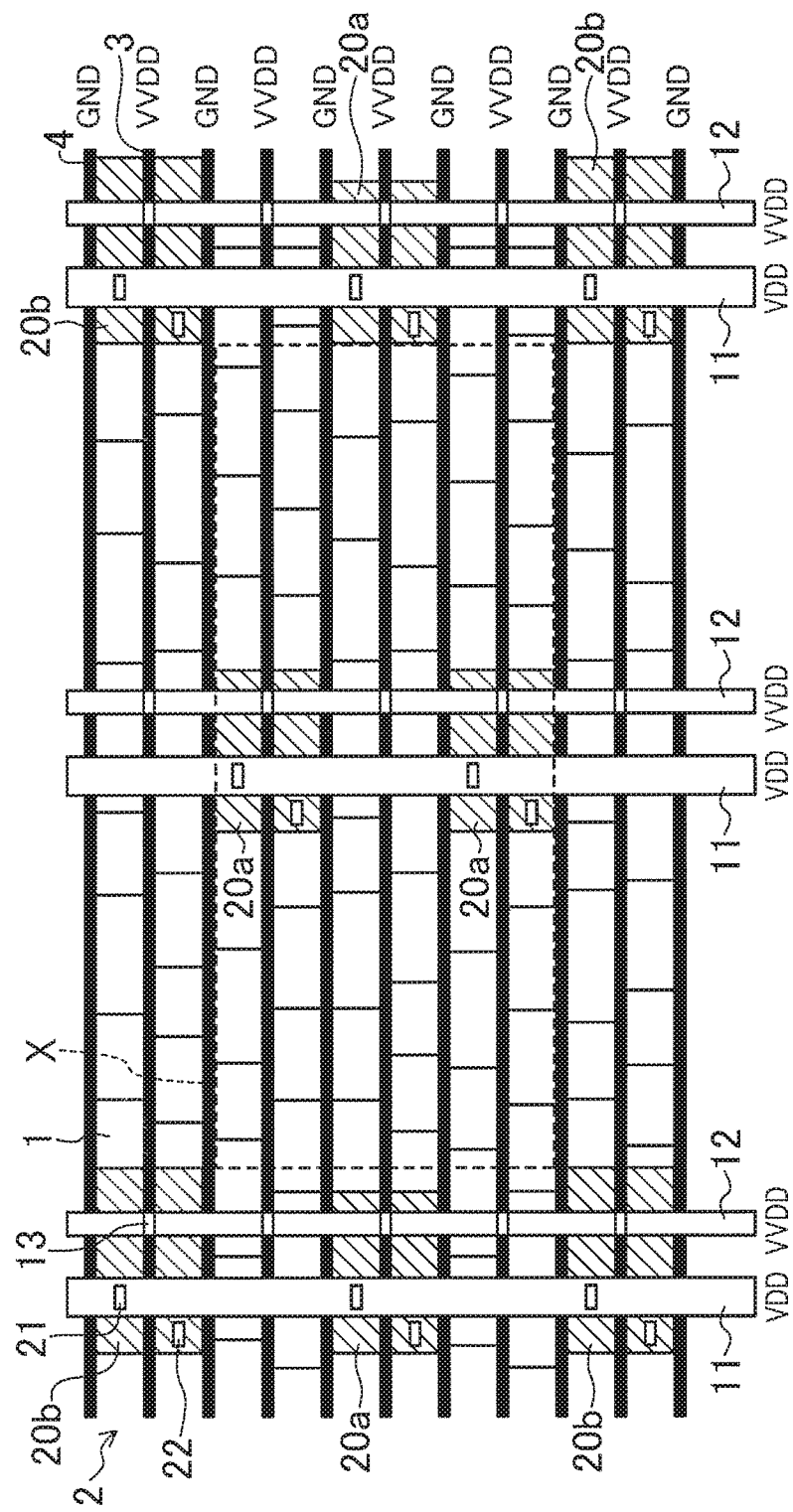
FIG. 8 is a plan view illustrating a configuration of a semiconductor integrated circuit device according to a fourth embodiment.

FIG. 8 is a plan view illustrating a configuration of a semiconductor integrated circuit device according to a fourth embodiment. In the second embodiment, the standard cells 1, the standard cell power supply lines 3, the ground supply lines 4, the power supply straps 11, and the sub-power supply straps 12 are arranged substantially in the same manner as shown in FIG. 1, and their detailed description may sometimes be omitted.

The configuration of FIG. 8 includes switch cells 20a having standard driving capability and switch cells 20b having improved driving capability. The switch cells 20a and 20b have different transistor sizes. A region X defined by a dotted rectangle is a region which requires enhanced power supply. The region X is occupied by the standard cells 1 arranged at high density, and thus, the switch cells 20a cannot be added any more in the region X. Therefore, the switch cells 20b with further improved driving capability than the switch cells 20a are arranged around the region X. This configuration allows the region X to receive power from the switch cells 20b with improved driving capability via the sub-power supply straps 12.

Other Embodiments

It has been described above that the power supply straps 11 are formed in the fifth wiring layer, and the sub-power supply straps 12 and 15 are formed in the third and fifth wiring layers. However, this is not limiting, and the power supply straps and the sub-power supply straps may be formed in other wiring layers. In one preferred embodiment, the sub-power supply straps are formed in the wiring layer which is as close as possible to the standard cell power supply lines. In so doing, the value of resistance of paths between the sub-power supply straps and the standard cell power supply lines, such as wiring and via structures, decreases. This can reduce drop of the power supply potential. Further, it has been described above that the standard cell power supply lines 3 are formed in the first wiring layer. However, this is not limiting, and the standard cell power supply lines 3 may be formed in two or more wiring layers, for example.

The configuration of the switch cell 20 shown in FIG. 2 is merely an example. The switch cell 20 may be configured in any way as long as it is capable of switching between electrical connection and disconnection between the standard cell power supply line 3 and the power supply strap 11 in accordance with a control signal. For example, the buffer 24 shown in FIG. 2 may be replaced with an inverter. In such a case, relationship between the logic of the control signal and connection/disconnection is reversed. Alternatively, two sets of the circuit configuration shown in FIG. 2 may be provided. The switch cell 20 shown in FIG. 2 is a double-height cell, which may be replaced with a single-height cell.

It has been described above that the switch cell 20 is provided for the standard cell power supply line 3 which supplies a power supply potential to the standard cells 1. As an alternative to this configuration, the switch cell may be provided for the ground supply line 4 which supplies a ground potential in the same configuration as described above. In such a case, the sub-power supply strap is connected to at least two ground supply lines including the one provided with the switch cell.

The present disclosure can achieve enhanced power supply in a semiconductor integrated circuit device using a power interruption technique, without increasing the number of switch cells, and thus, can effectively reduce power consumption and an area of LSIs, for example.

What is claimed is:

1. A semiconductor integrated circuit device, comprising:
   a plurality of standard cell rows, each of which includes a plurality of standard cells arranged in a first direction, arranged in a second direction perpendicular to the first direction when viewed in plan;
   a plurality of power supply lines extending in the first direction, and supplying power to the standard cells,
   a power supply strap formed in a layer above the plurality of power supply lines, and extending in the second direction;
   a switch cell provided for one of the plurality of power supply lines, and capable of switching between electrical connection and disconnection between the one of the power supply lines and the power supply strap in accordance with a control signal; and
   a sub-power supply strap formed in a layer above the plurality of power supply lines, and extending in the second direction, wherein
   the sub-power supply strap is connected to at least two of the power supply lines including the one of the power supply lines provided with the switch cell.

2. The semiconductor integrated circuit device of claim 1, wherein
   the sub-power supply strap is formed in a layer below the power supply strap.

3. The semiconductor integrated circuit device of claim 1, wherein
   the power supply strap overlaps with the switch cell when viewed in plan.

4. The semiconductor integrated circuit device of claim 1, wherein
   the sub-power supply strap overlaps with the switch cell when viewed in plan.

5. The semiconductor integrated circuit device of claim 1, wherein
   the plurality of power supply lines include two power supply lines arranged adjacent to each other, the two power supply lines each being provided with the switch cell.

6. The semiconductor integrated circuit device of claim 1, wherein
   the plurality of power supply lines include two power supply lines arranged adjacent to each other, one of the two power supply lines being provided with the switch cell, and the other being not.

7. The semiconductor integrated circuit device of claim 1, wherein
the power supply strap includes two power supply straps with two or more sub-power supply straps arranged therebetween, the two or more sub-power supply straps being included in the sub-power supply strap.

8. The semiconductor integrated circuit device of claim 1, wherein
the sub-power supply strap includes two sub-power supply straps which are formed in different layers.

9. The semiconductor integrated circuit device of claim 1, wherein
the switch cell includes two switch cells having different transistor sizes.

10. A semiconductor integrated circuit device, comprising:
a plurality of standard cell rows, each of which includes a plurality of standard cells arranged in a first direction, arranged in a second direction perpendicular to the first direction when viewed in plan;
a plurality of power supply lines extending in the first direction, and supplying power to the standard cells,
a power supply strap formed in a layer above the plurality of power supply lines, and extending in the second direction;
a switch cell provided for one of the plurality of power supply lines, and capable of switching between electrical connection and disconnection between the one of the power supply lines and the power supply strap in accordance with a control signal; and
a sub-power supply strap formed in a layer above the plurality of power supply lines, and extending in the second direction, wherein
the sub-power supply strap is connected to at least two of the power supply lines including the one of the power supply lines provided with the switch cell,
the plurality of power supply lines include a first power supply line and a second power supply line which are arranged adjacent to each other, and
the power supply strap includes two or more power supply straps, one of the power supply straps being provided with the switch cell at an intersection with the first power supply line, and no switch cell at an intersection with the second power supply line.

11. The semiconductor integrated circuit device of claim 10, wherein
the sub-power supply strap is formed in a layer below the power supply strap.

12. The semiconductor integrated circuit device of claim 10, wherein
the power supply strap overlaps with the switch cell when viewed in plan.

13. The semiconductor integrated circuit device of claim 10, wherein
the sub-power supply strap overlaps with the switch cell when viewed in plan.

14. The semiconductor integrated circuit device of claim 10, wherein
the plurality of power supply lines include two power supply lines arranged adjacent to each other, the two power supply lines each being provided with the switch cell.

15. The semiconductor integrated circuit device of claim 10, wherein
the plurality of power supply lines include two power supply lines arranged adjacent to each other, one of the two power supply lines being provided with the switch cell, and the other being not.

16. The semiconductor integrated circuit device of claim 10, wherein
the power supply strap includes two power supply straps with two or more sub-power supply straps arranged therebetween, the two or more sub-power supply straps being included in the sub-power supply strap.

17. The semiconductor integrated circuit device of claim 10, wherein
the sub-power supply strap includes two sub-power supply straps which are formed in different layers.

18. The semiconductor integrated circuit device of claim 10, wherein
the switch cell includes two switch cells having different transistor sizes.

* * * * *